Figure 1:
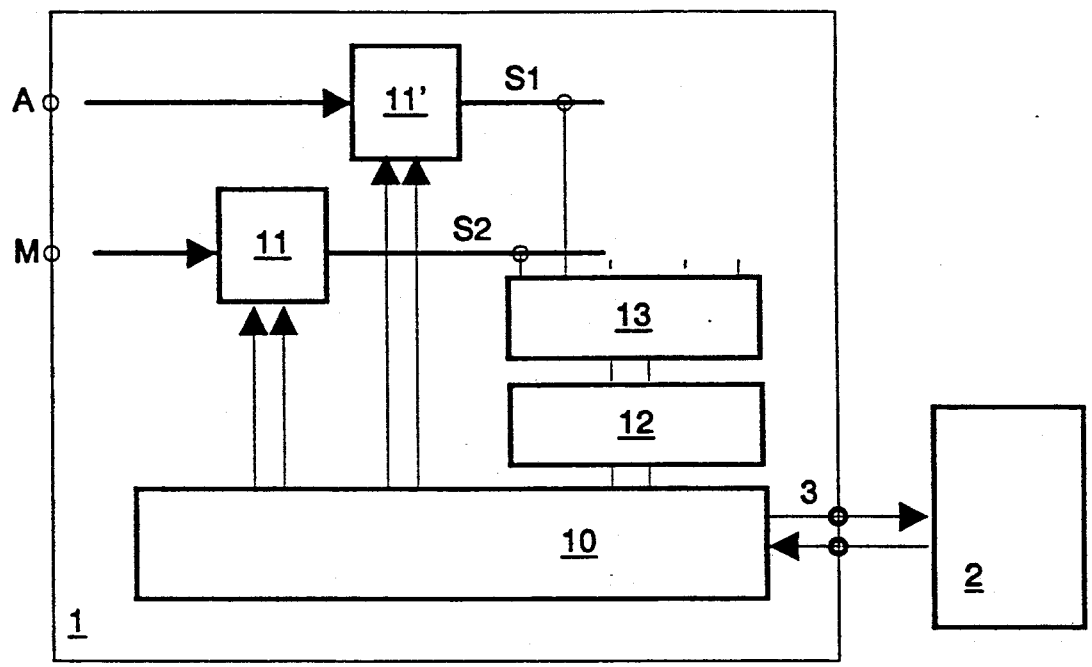

United States Patent [19]

Leppänen

[11] Patent Number: 5,077,783
[45] Date of Patent: Dec. 31, 1991

[54] METHOD OF SIMPLIFYING THE TUNING OF A RADIO TELEPHONE

[75] Inventor: Aki Leppänen, Salo, Finland

[73] Assignee: Nokia Mobile Phones Ltd., Salo, Finland

[21] Appl. No.: 583,943

[22] Filed: Sep. 17, 1990

[30] Foreign Application Priority Data

Sep. 25, 1989 [FI] Finland .................................. 894528

[51] Int. Cl.$^5$ ........................ H04B 7/26; H04B 17/00
[52] U.S. Cl. .......................................... 379/27; 379/1; 379/58; 455/67
[58] Field of Search .................. 379/27, 1, 58; 455/67, 455/71; 330/2

[56] References Cited

FOREIGN PATENT DOCUMENTS 59-66233  4/1984  Japan ..................................... 379/27

*Primary Examiner*—Stafford D. Schreyer
*Attorney, Agent, or Firm*—Darby & Darby

[57] ABSTRACT

In accordance with the invention a radio telephone (1) is tuned so that the tuning equipment (2) selects the signal (S1, S2) to be tuned via the microprocessor (10) and the multiplexer (13), and that the logic controlled amplifiers (11, 11') are controlled to obtain the desired tuning result. The set values corresponding to the tuning result are stored in the microprocessor memory. When the radio telephone is in operation, the signals are amplified in accordance to the set values. The tuning can be performed without opening the radio telephone.

8 Claims, 1 Drawing Sheet

METHOD OF SIMPLIFYING THE TUNING OF A RADIO TELEPHONE

The method relates to a method of simplifying the tuning of a radio telephone, having a logic section which controls the operation, and to the use of this method in series production and maintenance. The invention relates also to a radio telephone, which is tuned with a method according to the invention.

In the production and maintenance of radio telephones the tuning is one of the most time consuming stages. The tuning is generally made manually in prior art methods, although in some cases a tuning with the aid of robots could be possible. It is however common to these prior art methods to adjust electromechanical components, such as trimmer potentiometers, with the aid of tools.

The signals to be tuned in the known methods are generally measured by connecting the measuring equipment to test points on the radio telephone circuit board.

The known methods entail many problems and drawbacks. The trimmer potentiometers, being electromechanical components, are less reliable than the electronic components used in the radio telephone and they take up a substantial area on the device's circuit board. The need for a large space is a problem, particularly concerning handsets. In addition, tuning of the trimmers is slow and requires a skilled person performing the tuning. The tuning precision depends on the person, and thus human errors are possible. The radio telephone casing has to be opened for the tuning in order to get access to the various components.

The object of the invention is to devise a method, with which the above mentioned prior art problems and drawbacks are obviated.

The solution to the problem is achieved with the inventive method according to the characterizing clause of claim 1.

In the invention it is essential that the signal to be tuned is selected with the tuning equipment via the radio telephone's built-in logic section and multiplexer, and that the amplification of the logic controlled amplifiers is controlled by the tuning equipment via the logic section in order to obtain the desired tuning result, set values corresponding to the tuning results being stored in the radio telephone's memory, and whereby the respective signal is controlled through a logic controlled amplifier by the set values stored in the logic section when the radio telephone is in operation. Preferably the tuning is made by connecting the tuning equipment to the normal external connections of the radio telephone, the tuning being made without opening the radio telephone casing.

A radio telephone according to the invention comprises logic controlled amplifiers arranged in the signal paths and connected to the logic section, the amplifiers amplifying the signal according to data supplied by the logic section.

This tuning method may be applied to the final testing in series production of radio telephones, and to the maintenance of radio telephones.

Other preferred embodiments of the invention are presented in the subclaims.

Figure 2:
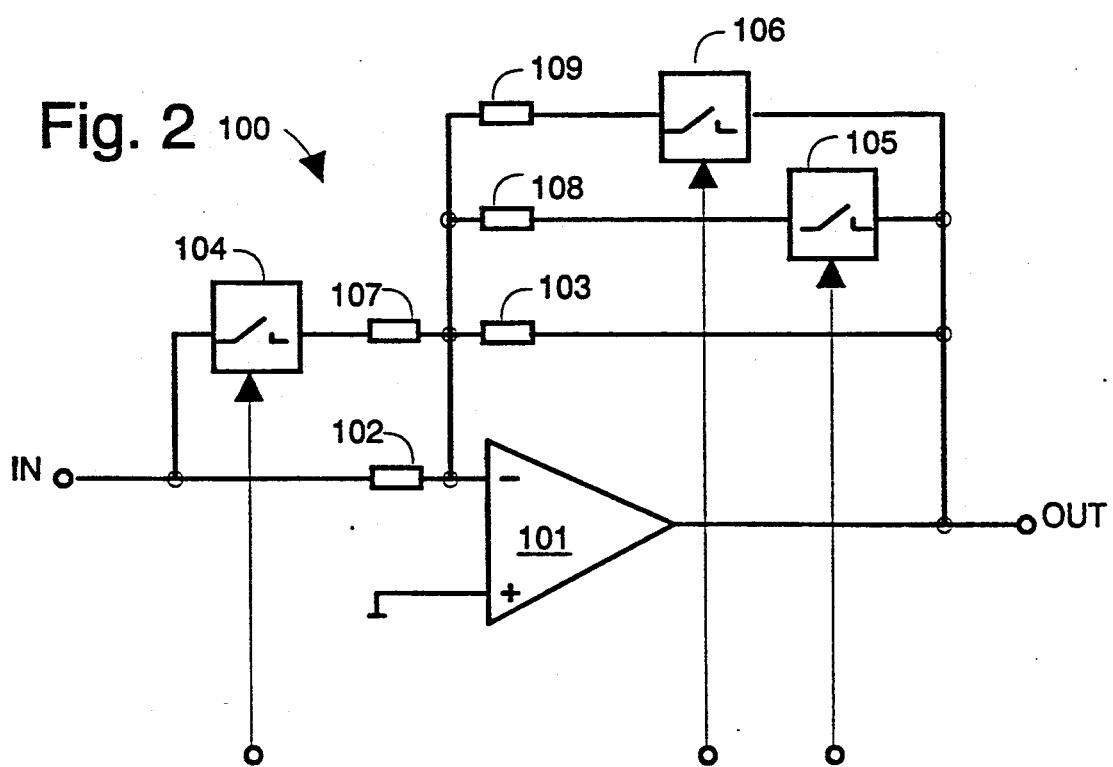

The invention is described in greater detail below by way of an example with reference to the accompanying drawing, in which:

FIG. 1 is a simplified block diagram illustrating the simple tuning arrangement according to the invention; and FIG. 2 is a circuit diagram of the logic controlled amplifier in a radio telephone according to the invention.

According to FIG. 1 the tuning equipment 2 is connected to signal interfaces A and M and the auxiliary equipment interface 3 of the radio telephone to be tuned. The signal interfaces are shown only schematically, and they may consist of e.g. the antenna interface and the microphone interface. The signal selected for tuning (A, M; for example a constant frequency antenna signal, or a constant sound pressure to the microphone) is directed from the measuring devices (not shown) in the tuning equipment 2 to the radio telephone. A measuring computer in the tuning equipment 2 is connected to the radio telephone microprocessor 10 through the auxiliary equipment interface 3. To the radio telephone microprocessor 10 is also connected logic controlled amplifiers 11, 11', with which the level of the signal S1 or S2 to be tuned can be adjusted, controlled during the tuning by the tuning equipment 2. According to the invention prior art trimmer potentiometers are replaced by the logic controlled amplifiers.

The tuning of the radio telephone according to the invention is carried out in the following manner.

1) The measuring computer in the tuning equipment 2, via the auxiliary equipment interface 3, the microprocessor 10 and the multiplexer 13, selects the desired signal or the signal to be measured, which is schematically shown at S1, S2 in the basic example of the figure.

2) information in digital form about the signal to be tuned is via the A/D-converter 12 directed to the microprocessor 10 and from there via the auxiliary equipment interface 3 to the measuring computer of the tuning equipment 2.

3) The information corresponding to the signal to be tuned, S1 or S2, is in the tuning equipment 2 compared with the target value. According to the result of the comparison it is calculated (or the measuring computer calculates in automatic tuning) how much the set value of the logic controlled amplifier 11, 11', has to be changed in order to obtain the correct signal level, and then the amplifier is controlled in a corresponding way through the microprocessor 10.

4) The tuning of the amplification of the logic controlled amplifier 11 or 11', respectively, is continued until the desired tuning result for the signal is obtained, or until the target value for the signal is obtained with a selected, sufficient precision.

5) The set values corresponding to the tuning result of the logic controlled amplifier are stored in the nonvolatile memory of the logic section 10.

The tuning is continued in accordance with steps 1) to 5) by selecting with the measuring computer a new signal S1 or S2 to be tuned, until all desired tuning stages are completed.

When the radio telephone is in operation, the logic controlled amplifier controls the respective signal in accordance with the stored set values.

In the production the tuning can be made in the final testing, when the radio telephone is otherwise completely ready. The tuning can now be made without opening the telephone's casing. Furthermore, by suitable programming of the measuring computer, the tuning can be made completely automatically, whereby the results of the tuning will become more reliable (no human errors), and individually for each radio telephone. Due to the automatization the testing throughput time and the amount of required personnel will be reduced. From a production management standpoint the inventive method signifies a great advantage, when for example the production is transferred to another plant, because the automatic tuning program does not require much training of personnel for the tuning tasks, as all information required in the tuning can be incorporated in the tuning programs of the measuring computer.

The tuning method according to the invention can also conveniently be used as a semiautomatic method in the maintenance of radio telephones, whereby the tuning equipment may be replaced by simpler service equipment, with which e.g. the signal levels in the radio telephone testing points are checked without opening the radio telephone casing. Thereby the measuring of the signals and the storing of tuning results will be carried out in the same way as in automatic tuning, but the person performing the tuning will decide on the correct values for the tuning results.

FIG. 2 shows a circuit diagram of a logic controlled amplifier 100 (reference numerals 11, 11' in FIG. 1) used in a radio telephone according to the invention. The amplifier 100 comprises an operational amplifier 101, feed-back resistors 102 and 103, and analog switches 104, 105 and 106. With the analog switches 104, 105 and 106, controlled by the microprocessor 10 (in FIG. 1), a desired combination of other feed-back resistors 107, 108 and 109 can be connected in parallel with the main feed-back resistors 102 and 103. In the example of FIG. 2 three switchable resistors are used, whereby the total number of the switchable amplification steps is 8. The number of the switchable resistors can of course be selected in accordance with the number of required amplification steps (the number of amplification steps=$2^N$, where N is the number of the switchable resistors).

The objects mentioned in the introduction will be met with a radio telephone according to the invention, because no trimmer potentiometers are required, whereby the reliability of the radio telephone is increased and the space requirements for the circuit board (boards) will be reduced. Tuning steps of separate modules are not needed either, because the tuning is made with an assembled radio telephone, utilizing its normal interfaces.

The invention can be applied to different types of analog and digital radio telephones, cellular radio telephones, portable and mobile radio telephones.

I claim:

1. A logic controlled method of tuning signals in a radio telephone having a logic section which controls its operation, characterized in that an external tuning equipment (2) is connected to the radio telephone's (1) signal interfaces (A, M) and auxiliary equipment interface (3) or corresponding interfaces, a test signal is connected to the radio telephone with the tuning equipment, the signal (S1, S2) to be tuned is selected via the radio telephone logic section (10), the auxiliary equipment interface (3) and the multiplexer (13), controlled by the tuning equipment (2), data proportional to the signal (S1, S2) to be tuned is directed through the A/D-converter (12), the logic section (10) and the auxiliary equipment interface (3) to the tuning equipment, the signal (S1, S2) to be tuned is compared with the target value in the tuning equipment (2), and in accordance with the comparison result the set value of the logic controlled amplifier (11, 11') is adjusted in a feed-back loop, until the desired tuning result for the signal (S1, S2) is obtained, the individual tuning results for the radio telephone (1) are stored in the non-volatile memory of the logic section (10), whereby the respective signal (S1, S2) is controlled with the stored set values during operation of the radio telephone.

2. Tuning method according to claim 1, characterized in that the tuning can be made without opening the radio telephone (1) casing.

3. Tuning method according to claim 1 or 2, characterized in that in the tuning equipment (2) is arranged a computer with a stored program and stored target values for the signal, according to which the tuning is performed, optionally either as automatic or semiautomatic tuning.

4. Tuning method according to claim 3, characterized in that computer supplies as a first set value to the logic section (10) the long-time mean value of the set values corresponding to the tuning results of previously tuned telephones.

5. The use of the tuning method according to claim 1 or 2 in the maintenance of radio telephones, whereby the tuning equipment consists of a service utility equipment, and whereby the signal levels in various test points can be checked and/or tuned with the aid of the service utility equipment.

6. Radio telephone tuned in accordance with the method of claim 1, characterized in that a multiplexer (13) is connected to the logic section (10) in order to select the signal to be tuned (S1, S2), and that in the signal path a logic controlled amplifier (11, 11') is arranged to amplify the signal (S1, S2) in accordance with the data supplied by the logic section (10).

7. A radio telephone according to claim 6, characterized in that the logic section (10) comprises a microprocessor.

8. A radio telephone according to claim 6 or 7, characterized in that the logic controlled amplifier (100; 11, 11,) consists of an operational amplifier (101), feed-back resistors (102, 103, 107-109), analog switches (104-106), which controlled by the logic section (10) connect in parallel the feed-back resistors (107-109) into the feed-back path producing the desired amplification.

* * * * *